May 27, 1952 A. W. DONELSON 2,598,237

AUTOMATIC VOLUME CONTROL SYSTEM

Filed May 7, 1947

INVENTOR
ARTHUR W. DONELSON
BY Elmer J. Gorn
ATTORNEY

Patented May 27, 1952 2,598,237

UNITED STATES PATENT OFFICE 2,598,237

AUTOMATIC VOLUME CONTROL SYSTEM

Arthur W. Donelson, Flint, Mich., assignor to Raytheon Manufacturing Company, Newton, Mass., a corporation of Delaware Application May 7, 1947, Serial No. 746,604

3 Claims. (Cl. 179—171)

This invention relates to improvements in gain control systems for audio amplifiers, and more particularly to those audio types of automatic volume control circuits known as volume compression systems.

It is an important object of this invention to provide an improved and simplified form of audio amplifier gain control readily adapted for use as an automatic volume control and volume compression system in audio amplifying circuits of limited frequency range, such as hearing aid amplifiers or the like, the improved automatic volume control system affording a maximum in simplicity of design for use in amplifiers having two or more cascade-coupled amplifying stages, without the generation of any appreciable even order harmonics distortion.

Figure 1:
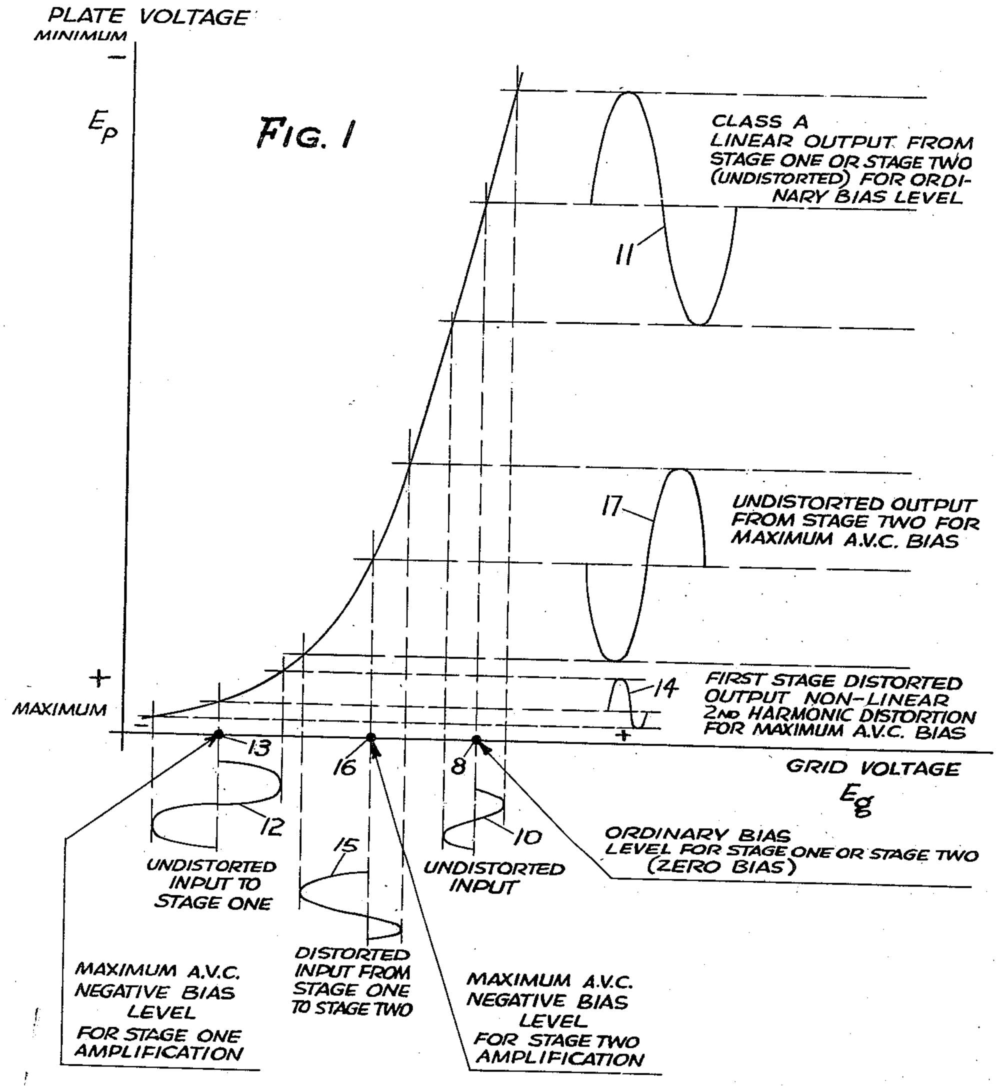
Figure 2:
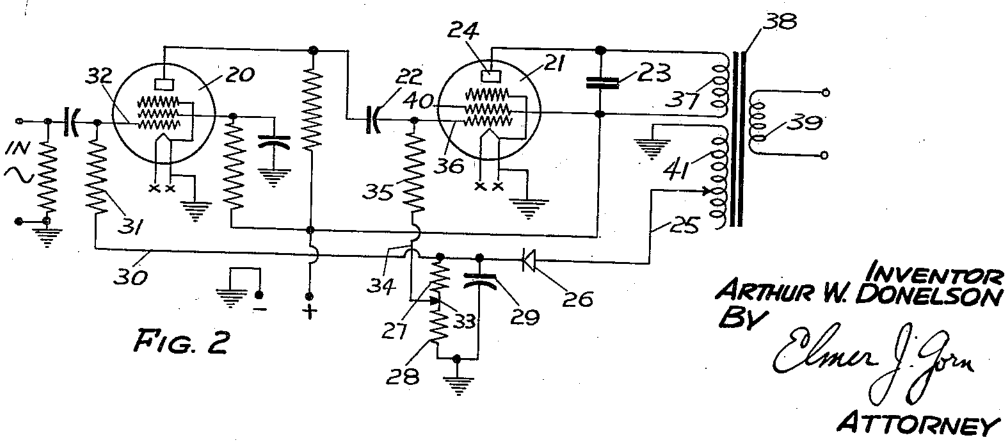

Additional objects and advantages of the invention will be apparent with reference to the following specification and drawing in which:

Fig. 1 is a dynamic characteristic response curve for a given amplifier type of vacuum tube such as a pentode tube and showing by arbitrary values the output waveform and amplitude of plate voltage for given arbitrary amplitude values of grid voltage swing at different levels of grid bias operation such as ordinary zero bias level and various negative bias levels under automatic volume voltage control; and Fig. 2 is a simplified schematic diagram of one form of a two-stage resistance coupled amplifier employing the novel automatic volume control circuit of this invention.

Referring to the dynamic tube characteristic curve of Fig. 1, the instantaneous tube plate voltage $E_p$ is plotted in arbitrary minimum and maximum values along the vertical axis with the maximum plate voltage at the base of the curve and the grid voltage $E_g$ is plotted in arbitrary values along the horizontal axis with the maximum negative or cut-off grid voltage at the base of the curve. It should be pointed out that the curve of Fig. 1 is not intended to be used to illustrate the amplification factor of any given tube, since the plate voltage axis is not calibrated in actual voltage values. The curve of Fig. 1 is to be considered useful only to illustrate distorted amplitude shapes of waveform resulting when a vacuum tube, which may be of the pentode type, is operated at or near its cut-off bend characteristic with a highly negative biased grid. Assuming the curve of Fig. 1 to be representative of an audio amplifying type of vacuum tube, having a linear amplifying characteristic for average input grid swing voltages when operated at the zero grid bias level 8 or contact potentials, it will be seen that the application of a moderate amplitude sinusoidally varying voltage 10 to the control grid will produce a similar amplified sinusoidal voltage waveform variation 11 in the tube plate voltage $E_p$. Since both the positive and negative excursions of the output voltage waveform 11 are approximately equal due to the linear characteristic of the tube response at zero grid bias level, it will be understood that such voltage output wave form 11 is relatively free of distortion. When, however, it is desired to control the amplification and in particular reduce the amplification obtained from a vacuum tube having the dynamic response characteristics of the curve of Fig. 1 in a simple manner by applying a high negative bias approaching cut-off bias on its control grid, particularly objectionable second harmonic distortion of the voltage output waveform results. For example, when the undistorted sinusoidally varying output voltage 12 is applied to the control grid of the tube operated with a high negative grid bias voltage of the arbitrary value 13 shown on the curve, the periodically varying voltage output waveform 14 is distorted, as shown, due to the rectifying action of the tube when operated under high negative bias conditions approaching tube cut-off. In the specific example shown, the plate voltage output 14 is so distorted that the amount of its negative excursion is twice the amount of its positive excursion and thus objectionable second harmonic distortion is produced.

It has been found, by this invention, that the amplification of audio amplifying vacuum tubes connected in an amplifier circuit having at least two stages of amplification may be controlled simply and reduced by applying high negative bias levels to the individual amplifying tubes without the generation of the even order harmonic distortion referred to, if a certain fixed proportionality between a high negative bias level on the first amplifying stage and a somewhat lower negative bias level on the second amplifying stage is maintained. For example, consider that the distorted plate voltage signal output 14 from the first amplifying stage operated at a high negative bias level 13 is applied as a distorted signal input 15 to the second stage amplifying tube which is operated at a somewhat lower negative bias level 16 fixed at a proportionate value of the high negative bias level 13 of the first stage amplifying tube. It will be seen from the curve of Fig. 1 that the periodically varying plate voltage output 17 will be undistorted and again have the sinusoidally varying characteristics of the original input signal 12. Thus, in such manner, the second harmonic distortion generated in the output of stage one is balanced out in stage two when the amplifier is operated under reduced gain conditions with high negative bias levels for the amplifying tube stages. It should be understood that the proportionate amplitude variations of the various waveform signals 10, 11, 12, 14, 15 and 17 as shown on the drawing are not indicative of their actual proportional amplitude characteristics, since, as previously mentioned, the curve of Fig. 1 is not properly calibrated to allow for the amplification characteristics of any given vacuum tube. However, the voltage curves are indicative of the distortionate amplications of the positive and negative excursions of each periodically varying voltage and it should be pointed out that the waveform of the input voltage signal 15 for stage two is an exact mirror image of the output voltage waveform 14 from stage one, the negative excursion being twice the positive excursion.

If the proportionality between the negative bias levels 13 and 16 for amplifying stages one and two, respectively, is maintained, the degree of amplification for the audio amplifier may be readily controlled by varying the negative bias on amplifying stages one and two without the introduction of objectionable amounts of even order harmonic distortion. It should be pointed out that a lower or higher value for the negative bias level 16 other than a predetermined proportionate value with reference to the same high negative bias level 13 of stage one will not result in a complete reduction of the even order harmonic distortion, and may even result in additional amplification of the distortion. Therefore, in order to secure such complete reduction of distortion, the proportionality between bias levels 13 and 16 for amplifying stages one and two should be accurately determined in accordance with the characteristics of the amplifying tubes in stages one and two and the voltage gain obtained from stage one under a given level of high negative bias operation. The proportionality may be accurately determined by reducing the negative bias level 16 on stage two from the high negative bias level of stage one, without changing the bias level of stage one, until the voltage output waveform from stage two as indicated by an oscilloscope or the like is substantially free of even order harmonic distortion. Having once determined the degree of proportionality between bias levels 13 and 16 for stages one and two, respectively, this proportionality may be maintained for all negative bias levels of operation and the gain of the amplifier may be readily controlled by such variation in negative bias levels of operation without the introduction of distortion.

The above described method of controlling audio amplifier gain may be applied to an automatic volume control or volume compression system in audio amplifiers of limited frequency range such as hearing aid amplifiers. Fig. 2 of the drawings shows a simplified form of two-stage resistance coupled audio amplifier system employing, for example, the pentode vacuum tubes 20 and 21 for amplifying stages one and two, respectively. The resistance coupled amplifying system is provided in stage one with the usual arrangement of plate load and screen voltage dropping resistors together with the plate-to-grid coupling condenser 22, which may be of relatively small capacitance in order to prevent the amplification of frequencies below approximately 100 cycles per second. The output from tube 21 is supplied to the primary winding 37 of the output transformer 38, whose secondary winding 39 supplies a suitable output load device. The primary winding 37 is connected between the anode 24 and number two grid 40 of tube 21. A condenser 23 connected across the primary winding 37 tunes said primary winding over a relatively broad resonant peak, but reduces the load on the plate 24 for frequencies outside of said peak. In this way the circuit discriminates against residual second and third harmonics. Thus, for example, the condenser 23 prevents amplifier response above approximately 6,000 cycles per second. Such amplifier frequency response characteristic is desirable in hearing aid devices and is also of advantage when using the following described volume compression system of this invention, having a suitable time constant of response such that some audio feedback is inevitable.

A portion of the output signal from the plate 24 is derived from a tertiary winding 41 on the transformer 38 and is connected by line 25 to be rectified by the rectifying device 26, of any suitable type, to produce a negative voltage across the voltage divider comprised of resistors 27 and 28 shunted by a filter and time constant condenser 29 to ground. The full negative voltage output for a maximum automatic voltage control action appears across line 30 and ground and may have a maximum value on the order of magnitude approaching a high negative cut-off bias for the first amplifying tube 20. The negative potential in line 30 is applied through the grid load resistance 31 to the control grid 32 of the first stage amplifying tube 20. A fixed proportion of the high negative bias voltage of line 30 appears at the voltage divider tap 33 and is conducted by line 34 through the grid load resistance 35 to the control grid 36 of the second stage amplifying tube 24. It will be understood that the amplifying circuit is provided with suitable operating voltages, not described, and that the proportionality between the negative bias voltage on the control grids 32 and 36 of the first and second amplifying stages, respectively, is determined in accordance with the foregoing description in connection with the curve of Fig. 1 of the drawing. The provision of the tertiary winding 41 to derive a signal to be fed to the rectifier 26 results in the proper time constant for the system, permitting a relatively rapid rise in control voltage without adverse effects.

The operation of the automatic volume control or audio volume compression circuit of Fig. 2 should now be apparent. Since all presently known types of rectifying devices 26 are not perfect, and the condenser 29 must be selected to provide a suitable automatic volume control response time constant, it is apparent that the amplifier circuit would tend to oscillate if its frequency response range were not limited in the aforesaid manner as particularly designed for hearing aid amplifiers. It should be understood that the audio automatic volume control system of this invention may be applied to any type of audio amplifier, resistance coupled or transformer coupled, embodying at least two stages of amplification, and also may be used in amplifiers embodying a voltage gain and a power amplifying stage, so long as the proportionality between the negative automatic volume control bias levels for the two successive stages of amplification is determined and fixed over the entire range of automatic volume control negative bias and gain control operation.

This invention has taught the necessity of proportioning the negative bias levels between two stages of audio amplification, when controlling the gain of the amplifier by operating the tubes at suitable high negative bias levels approaching cut-off bias, in a manner to prevent generation of even order harmonics by the amplifying system.

Various modifications will occur to those skilled in the art without departing from the spirit of the invention and the scope of the appended claims.

What is claimed is:

1. An automatic gain control system for audio amplifying circuits of the type including at least two successive stages of electron discharge tube audio amplification comprising means for applying a high negative bias level approaching cut-off bias to the vacuum tube of the first audio stage, said means operating to decrease said negative bias in accordance with the tendency of the amplifier output signal to decrease, and means to apply a fixed proportion of said bias level as a second smaller negative bias level to the vacuum tube of the succeeding audio stage, the bias proportion between said audio stages being of a value to operate said vacuum tubes at different points on their dynamic response curve so that the even order harmonic distortion generated in said first audio stage is substantially balanced out in said second audio stage to produce substantially undistorted amplifier output when the amplifying system is operated under said negative bias levels.

2. An automatic gain control system of the type including at least two successive stages of electron discharge tube audio amplification comprising means to rectify a portion of the amplifier output voltage to produce a negative voltage varying in magnitude in proportion to the amplitude of the output signal, means for applying a portion of said negative voltage as a first negative bias to the vacuum tube of the first audio stage, means to apply a fixed fractional proportion of said bias as a second negative bias to the vacuum tube of the succeeding audio stage, the bias proportion between said audio stages being of a value to operate said vacuum tubes at different points on their dynamic response curves so that the even order harmonic distortion generated in said first audio stage is substantially balanced out in said second audio stage to produce substantially undistorted signal output when the amplifying system is operated under said negative bias conditions.

3. An automatic gain control system for audio amplifying circuits of the type including at least two successive stages of electron discharge tube audio amplification comprising means to rectify a portion of the amplifier output voltage to produce a negative voltage varying in magnitude in proportion to the amplitude of the output signal, time constant means to filter said negative voltage, means for applying a portion of said negative voltage as a first negative bias to the vacuum tube of the first audio stage, means to apply a fixed proportion of said bias as a second smaller negative bias to the vacuum tube of the succeeding audio stage, the bias proportion between said audio stages being of a value to operate said vacuum tubes at different points on their dynamic response curves so that the even order harmonic distortion generated in said first audio stage is substantially balanced out in said second audio stage to produce substantially undistorted signal output when the amplifying system is operated under said negative bias conditions.

ARTHUR W. DONELSON.

REFERENCES CITED

The following references are of record in the file of this patent:

UNITED STATES PATENTS

| Number | Name | Date |
|---|---|---|
| 2,077,126 | O'Brien | Apr. 13, 1937 |
| 2,137,867 | Wessels | Nov. 22, 1938 |
| 2,207,094 | Getaz | July 9, 1940 |
| 2,323,211 | Faltico | June 29, 1943 |
| 2,334,468 | Adams | Nov. 16, 1943 |
| 2,395,770 | Vilkomerson | Feb. 26, 1946 |